United States Patent [19]
Bolden et al.

[11] Patent Number: 5,340,407
[45] Date of Patent: * Aug. 23, 1994

[54] PROCESS OF REMOVING SOLDERING FLUX AND/OR ADHESIVE TAPE RESIDUE FROM A SUBSTRATE

[75] Inventors: Paul L. Bolden; Michael E. Hayes, both of Fernandina Beach, Fla.

[73] Assignee: Petroferm Inc., Fernandina Beach, Fla.

[*] Notice: The portion of the term of this patent subsequent to Jun. 9, 2009 has been disclaimed.

[21] Appl. No.: 896,051

[22] Filed: Jun. 9, 1992

Related U.S. Application Data

[60] Continuation of Ser. No. 620,500, Nov. 29, 1990, Pat. No. 5,120,371, and a continuation-in-part of Ser. No. 852,488, Mar. 16, 1992, which is a continuation of Ser. No. 516,417, Apr. 30, 1990, abandoned, which is a division of Ser. No. 305,897, Feb. 2, 1989, Pat. No. 4,934,391, which is a continuation-in-part of Ser. No. 153,637, Feb. 8, 1988, abandoned.

[51] Int. Cl.$^5$ .............................................. B08B 3/08
[52] U.S. Cl. ........................................ 134/26; 134/40; 134/42
[58] Field of Search ................ 134/38, 40, 42, 26; 252/162, 164, 170, DIG. 14

[56] References Cited

U.S. PATENT DOCUMENTS

| | | | |
|---|---|---|---|
| 4,740,247 | 4/1988 | Hayes et al. | 134/40 |
| 4,790,951 | 12/1988 | Frieser et al. | 252/162 |
| 4,867,800 | 9/1989 | Dishart et al. | 134/40 |
| 4,983,224 | 1/1991 | Mombrun et al. | 134/40 |

*Primary Examiner*—R. Bruce Breneman
*Assistant Examiner*—Saeed T. Chaudhry
*Attorney, Agent, or Firm*—Synnestvedt & Lechner

[57] ABSTRACT

Disclosed is an industrial cleaning process in which a contaminant comprising soldering flux and/or adhesive tape residue is removed from a substrate contaminated therewith. The process comprises the steps of contacting the substrate with a terpene-based cleaning composition which is substantially free of water-soluble organic material; removing the composition and solubilized contaminant from the substrate by contact with water having a temperature of about 70° F. to about 140° F. for a period of time of no longer than about 10 minutes to provide a substrate having a contamination rating of no greater than about 14 micrograms NaCl equivalent/square inch (MIL-P-28809A), and to thereby form a mixture comprising the composition, contaminant and water. The process also comprises separating the water from said mixture, the separated water being substantially free of water-soluble organic material and having a chemical oxygen demand of no greater than about 1,000 ppm.

10 Claims, No Drawings

PROCESS OF REMOVING SOLDERING FLUX AND/OR ADHESIVE TAPE RESIDUE FROM A SUBSTRATE

This is a continuation of application Ser. No. 07/620,500, filed Nov. 29, 1990, now U.S. Pat. No. 5,120,371, and a continuation-in-part of U.S. patent application Ser. No. 07/852,488, now pending, which in turn is a continuation of U.S. application Ser. No. 07/516,417, filed Apr. 30, 1990, now abandoned, which in turn was a divisional of U.S. application Ser. No. 07/305,897, filed Feb. 2, 1989, now U.S. Pat. No. 4,934,391, which in turn is a continuation-in-part of U.S. application Ser. No. 07/153,637, filed Feb. 8, 1988, now abandoned.

FIELD OF THE INVENTION

This invention relates to the removal of deposits of soldering flux and/or other residues from a substrate which is contaminated therewith. More specifically, this invention relates to the use of terpenes in an improved cleaning process for removing contaminants such as soldering flux and/or adhesive tape residue from a substrate.

The invention will be described initially in connection with its applicability to the cleaning of printed circuit boards. However, the invention has wider applicability, as described hereinbelow.

In the fabrication of printed circuit boards, it is known to use soldering fluxes in order to ensure the firm, uniform bonding thereto of solder which functions to adhere to the boards components thereof. Such flux must be removed from the finished board. If not removed, deposits of the flux, in even trace or minute amounts, can cause the circuitry of the board to fail. An example of a flux that is widely used in the fabrication of printed circuit boards is rosin flux, a material which is water insoluble.

Various types of materials have been proposed for cleaning deposits of rosin flux from the surface of a printed circuit board. Traditionally, chlorinated hydrocarbon solvents were used widely. However, these materials are not presently favored because of environmental problems that are associated therewith. Examples of other cleaning materials for removing deposits of rosin flux from substrates contaminated therewith include: (a) alkaline cleaning compounds such as alkanol amines; (b) a mixture of N-methyl-2-pyrrolidine and an alkanol amine (U.S. Pat. No. 4,276,186); (c) terpene compounds; and (d) dibasic acid esters (U.S. Pat. No. 4,934,391).

Although there are advantages and disadvantages associated with the use of each of the aforementioned type cleaning materials, the use of terpene compounds in cleaning printed circuit boards of flux deposits is becoming more and more popular because they possess a combination of unusually desirable properties. The present invention is directed to an improved process for cleaning printed circuit boards and other substrates of deposits of soldering flux and/or other residues with terpene-based cleaning compositions.

REPORTED DEVELOPMENTS

In the cleaning operation, deposits of soldering flux are dissolved by the water-insoluble, liquid terpene compounds as they are contacted therewith. A review of the related art reveals that special consideration is given to removing from the terpene-treated substrate the dissolved contaminants that adhere thereto for those applications which require that the substrate be highly cleaned. Thus, the effective removal from the substrate of the dissolved soldering flux and the terpene solvent from the substrate in which the flux is dissolved is an important aspect of the overall cleaning process.

The basic patent on the use of terpenes to clean printed circuit boards of soldering flux is U.S. Pat. No. 4,640,719, assigned to the same assignee as the present invention. With respect to the removal from the terpene-treated substrate of dissolved flux and other contaminants, this patent teaches as follows:

"Because they [terpene compounds] are almost completely insoluble in water, however, the terpenes cannot be directly flushed away by water. Alternatively and preferably, the terpene compounds are combined with one or more terpene emulsifying surfactants. The addition of such surfactants facilitates removal of the terpenes from printed wiring boards by rinsing with water, whereby the terpenes are formed into oil-in-water emulsions." (Column 3, lines 54–62)

The '719 patent discloses further that the terpene-based composition can include up to 40 wt. % of the emulsifying surfactant, with a preferred composition containing 10 wt. % of surfactant. Such surfactants are typically water-soluble organic materials.

European patent application bearing publication number 0 354 027 A2 discloses cleaning compositions comprising a major amount of selected cyclic terpenes, including para-menthadienes, and a minor amount of terpene alcohol for use in cleaning a variety of substrates, including circuit boards. This patent discloses that the compositions can include surfactants and specifically states the following:

"It has been found helpful to add surfactants to solvent compositions which are to be used in combination with a water rinse. It has been found that the addition of the surfactant to the cyclic terpene mixture enhances the water rinsability of the solvent composition. Further, it has been found that in dealing with certain types of soil, the addition of a surfactant to the mixture of cyclic terpenes enhances the ability of the cyclic terpene mixture to remove the soil from the substrate."(Column 4, line 57 to Column 5, line 1)

This publication discloses further that the surfactants can be used in concentrations of from 0.1 to 10 wt. %.

Another patent which relates to the removal of soldering flux from substrates such as printed circuit boards is U.S. Pat. No. 4,867,800. The cleaning composition which is the subject of this patent comprises a terpene compound and a dibasic ester which has at least 2 wt. % solubility in water at 25° C. This patent discloses that such compositions can be used to achieve improved cleaning relative to the use of terpene-based compositions that include emulsifying surfactants, which the patentee refers to as an unnecessary, but optional ingredient of his composition. The patent discloses also that the terpene-treated surface is preferably rinsed with water, such as deionized water. In an exemplary embodiment disclosed in the patent, the rinse water which was used in the cleaning process had a temperature of about 150° F.

A common characteristic of each of the processes described in the aforementioned publications is the required or preferred use of water-soluble organic materials in combination with the terpene constituent of the cleaning composition. While considered essential to achieve high grade cleaning, the presence of such water-soluble organic materials leads to problems which are associated with other aspects of the overall cleaning process.

One significant problem crops up in connection with disposal of the rinse water that is generated during the cleaning process. The amount of such rinse water can be substantial, with some industrial applications using, for example, two to five gallons of rinse water per minute of operating time. For various industrial applications, it is considered ideal to simply discharge the rinse water into the local sewage system. However, as a result of the use in the cleaning composition of water-soluble materials, such discharge typically runs afoul of environmental standards which require that the chemical oxygen demand (COD) of the discharged water be no greater than some defined value. For example, some communities specify that the COD should be no greater than about, 1000 ppm for industrial water that is discharged into the local sewage system. There are other communities with even higher standards, for example, CODs of no greater than about 300 ppm. However, in using cleaning compositions of the type described above, the presence of the water-soluble materials can result in the rinse water having as much as 10,000 ppm or more of COD. This indeed presents a problem for the fabricators of circuit boards inasmuch as it requires the fabricators to adopt additional steps to treat the water in a manner such that environmental standards are met. This, of course, increases the cost of the overall manufacturing process.

There are reports (unconfirmed) of the use of surfactant-free, terpene-based compositions in applications for removing solder fluxes from various types of substrates. However, it appears that, in such applications, the tarpone-treated substrate is rinsed with surfactant-containing water or requires that the substrate be rinsed with either boiling water or near boiling water. This, of course, is undesirable because of the increased costs associated with the provision of energy that is needed to heat the significant amounts of water that are required for the rinsing operation.

In view of exemplary shortcomings of the present state of the art related to the use of terpene-based compositions to clean soldering flux from the surfaces of printed circuit boards, as described above, the present invention is directed to an improved, more efficient and economical process which avoids or significantly alleviates such shortcomings.

SUMMARY OF THE INVENTION

In accordance with the present invention, there is provided an industrial cleaning process in which a contaminant comprising soldering flux and/or adhesive tape residue is removed from a substrate contaminated therewith comprising:

(A) contacting the substrate with a terpene-based cleaning composition which is substantially free of water-soluble organic material for a period of time sufficient to solubilize the contaminant;

(B) removing the composition and solubilized contaminant from the substrate by contact with water having a temperature of about 70° F. to about 140° F. for a period of time of no longer than about 10 minutes to provide a substrate having a contamination rating of no greater than about 14 micrograms NaCl equivalent/square inch (MIL-P-28809A), and to thereby form a mixture comprising the composition, contaminant and water; and (C) separating the water from said mixture, the separated water being substantially free of water-soluble organic material and having a chemical oxygen demand of no greater than about 1,000 ppm.

With respect to Step (A) above, the following procedure is used to determine the content of water-soluble organic material in a terpene-based composition. Equal volumes of water and the terpene-based composition are combined and allowed to separate into two distinct phases or layers. To the extent that the terpene-based composition contains water-soluble organic material, it will migrate to the water layer. The COD of the water layer is then determined according to standard technique. When the water layer has a COD of no greater than about 1,000 ppm, the terpene-based composition is considered to be "substantially free of water-soluble organic material".

Thus, in accordance with the present invention, it has been found, contrary to the teachings of the prior art, that it is possible to produce a highly clean surface by the use of a terpene-based cleaning composition which is free of or essentially free of emulsifying surfactants and/or other water-soluble organic materials. And such highly cleaned surfaces can be produced under practical operating conditions, for example, at ambient temperature or relatively low elevated temperature and within times and water contact conditions that are presently used in industrial applications. And of great advantage is the fact that the water collected from the cleaning process has a sufficiently low COD to enable it to be lawfully discharged to a sewage system without purification or other treatment. Alternatively, the collected water can be recycled for use in the cleaning process, as described hereinbelow.

With respect to the high degree of cleaning that can be achieved by use of the present invention, the present cleaning process can be used to produce levels of residual contamination that are equal to or far below the military requirement of 14 micrograms NaCl equivalent/$in^2$ (MIL-P-28809A) (see the aforementioned '719 patent, column 7, lines 18 to 32 for additional information concerning the evaluation of the degree of cleanliness of substrates based on the involved military test). A specific example of the degree of cleanliness that can be achieved by practice of the present invention is set forth in the Example section hereinbelow.

DETAILED DESCRIPTION OF THE INVENTION

An important characteristic of tile present invention is that it is capable of being used effectively in an industrial cleaning process, as distinguished from a cleaning process that is simply carried out on a laboratory scale or a pilot-plant scale. The invention can be practiced in either a batch or continuous cleaning process.

Although it is expected that the invention will be used most widely in cleaning printed circuit boards, it has wider applicability in that it can be used to clean any type of substrate which is contaminated with soldering flux and/or other types of residue that typically contaminate the surfaces of printed circuit boards, for example, adhesive tape residue, waxes and fingerprints. Thus, printed wiring boards and other articles which require the use of soldering flux in the making of mechanical, electromechanical or electronic connections with metal can be cleaned in accordance with the present invention. In the fabrication of such articles, rosin soldering flux is used widely. However, there also can be used other types of soldering fluxes, including, for example, synthetic activated fluxes, organic acid-based fluxes and fluxes contained within soldering paste.

The terpene-based cleaning composition for use in the practice of the present invention comprises at least about 60 wt. % terpene, more preferably at least about 80 wt. % terpene, and most preferably about 85 to about 95 wt. % terpene. The composition can comprise about 100 wt. % terpene, but preferably is used in admixture with another constituent as described hereinbelow.

The terpene for use in the practice of the present invention is a terpene compound or a mixture of terpene compounds that are substantially water-insoluble and that are capable of dissolving the involved contaminants. The use of such terpenes to clean printed circuit boards and related types of articles of contaminants is well known. For practice of the present invention, the use of para-menthadienes is preferred, with dipentenes being more preferred and limonene being most preferred. Excellent results have been achieved utilizing a mixture of terpenes in which about 90 to about 95 wt. % of the mixture is limonene (the major portion being d-limonene), with the balance of the mixture being other terpene compounds.

A particularly preferred embodiment of the present invention comprises a terpene-based composition which includes also a monobasic ester, which is a material that is also substantially water insoluble. Such esters generally comprise the reaction product of alkyl alcohols and fatty acids, for example, $C_1$ to about $C_6$ alkanols and about $C_8$ to about $C_{18}$ fatty acids. Preferably $C_1$ to $C_4$ alcohols are used. A preferred monobasic ester is methyl laurate, with isopropyl laurate being more preferred.

The monobasic ester can comprise up to about 40 wt. % of the terpene-based composition, but preferably comprises up to about 20 wt. %, most preferably about 5 to about 15 wt. % of tile composition. Particularly good results having been achieved with the use of about 10 wt. % of the ester.

It should be understood that a material different from a monobasic ester (an optional, but preferred ingredient) can also be included in the terpene-based cleaning composition. Such material is desirably one which meets the COD standards set forth herein. As mentioned above, the terpene-based cleaning composition is substantially free of water-soluble material, that is, according to the procedure described above, the COD of the water phase of a two-phase mixture of equal amounts of the terpene-based cleaning composition and water is not greater than anbout 1000 ppm.

The contaminated surface should be contacted with the cleaning composition for a period of time sufficient to solubilize the contaminant. The time for effecting solubilization will depend on the temperature of the cleaning composition and the means by which it is applied. The temperature of the composition can be like that typically used for terpene-based compositions in applications of the present type, for example, room or ambient temperature (about 70° F.) to about 150° F. Exemplary means for applying the cleaning composition are immersion, brushing, and spraying, for example, spraying in air or beneath the surface of the cleaning composition. It is believed that spraying the cleaning composition onto the substrate will be used most widely. For batch operations, typical contact times are about 3 to about 5 minutes. For continuous operations, typical contact times are about 30 seconds to about 2 minutes.

The solubilized contaminant is removed from the terpene-treated substrate by contact with water having a temperature of about 70° F. to about 140° F. Preferably, the temperature of the water is about 110° F. to about 130° F. Water-contact times of the type generally used in the art can be used, for example, not longer than about 10 minutes. Preferably, the water-contact time does not exceed about 5 minutes. Good results have been achieved with a contact time of about two minutes.

Conventional means can be used to apply the water. It is believed that, for most applications, spraying the air-borne substrate will be satisfactory and convenient. A spray pressure of about 30 to about 50 psi is exemplary. Other means for applying the water can be used also, for example, ultrasonic water agitation.

After the solubilized contaminants have been removed from the substrate, the substrate is dried. Typically, drying will be accelerated by the use of heat. For example, the substrate can be dried in an oven and/or it can be dried with forced air, for example, heated to 100° F. or above.

With respect to the degree of substrate cleanliness that can be achieved by the practice of the present invention, levels of contamination that meet or are below the military specification MIL-P-28809A requirement of 14 micrograms NaCl equivalent/square inch can be achieved. The invention has been used effectively to provide substrates having a contamination level below about 10 micrograms NaCl equivalent/square inch.

It should be understood that such low levels of contamination can be achieved without the use of a surfactant in the water which is used to remove the solubilized contaminant from the substrate. Indeed, the COD of such water should be such as to meet the COD requirements set forth herein. Deionized water is used preferably.

The effluent produced by the cleaning process comprises a liquid mixture of the terpene-based cleaning composition, contaminant dissolved therein, and water. The liquid mixture may contain some solids, for example, minute pieces of solder and miscellaneous debris. The nature of the liquid mixture produced in accordance with the present invention is such that the components thereof can be separated conveniently by gravitational force. Thus, upon being fed to a settling tank, solids precipitate from the mixture and the liquid components thereof stratify into a top layer comprising the water insoluble or immiscible liquids, that is, terpenes and organic materials dissolved therein, including contaminants, and an aqueous bottom layer. The nature of the process is such that the aqueous layer is substantially free of water-soluble organic material, that is, it has a COD of no greater than about 1000 ppm. Indeed, the process of the present invention can be utilized effectively to provide an aqueous phase in which the COD thereof is about 300 ppm or less, for example, no greater than about 150 ppm. And, this can be accomplished without subjecting the water to any purifying steps or dilution.

In separating the different phases of the liquid mixture, the top organic layer can be simply drawn off. If desired, the aqueous phase can then be discharged directly into the sewage system, while meeting the COD demands imposed by the involved governmental agency. If desired, the aqueous phase can be recycled for reuse in the cleaning process. This will generally involve the steps of filtration to separate solids and ion exchange to remove undesirable inorganic materials, the latter step being preceded by carbon adsorption (if necessary) to remove organic materials that may adversely affect the ion exchange step. Other means may be used to purify the water.

Other means can be used to separate the liquid phases of the mixture, for example, centrifugation or by use of appropriate membranes.

The terpene compounds can be treated for recycling or they can be disposed of in an appropriate way, for example, incineration.

EXAMPLES

This example is illustrative of the practice of the present invention.

Example No. 1

A set of three identical printed circuit boards was fluxed with a rosin soldering flux (ALPHA 627 flux sold by Alpha Metals Inc. of Jersey City, N.J.), wave soldered, and then cleaned of the flux residue that was adhered to each of the boards.

The cleaning composition contained terpenes which were derived from orange peels and which comprised about 95 wt. % limonene and 5 wt. % of a mixture of other terpene compounds. The cleaning composition was substantially free of water-soluble organic materials. The boards were placed in the rack of an industrial dishwasher (semi-aqueous cleaning module) sold by Electronic Controls Design as Model 6307. The cleaning operation involved spraying the boards for about 5 minutes with the cleaning composition which was at room temperature (about 75° F.).

The terpene-treated boards were then rinsed with water to remove the cleaning composition and flux dissolved therein. This was accomplished by subjecting the boards to a 1-minute, 20-second water wash in a continuous process carried out in an Electrovert H-500 water rinse unit sold by Electrovert of Arlington, Tex. The spray pressure was about 40 pounds/square inch. The temperature of the water was about 120° F. The water collected from the rinsing operation has a COD well below 1000 ppm. Thereafter, each of the cleaned boards was dried with hot air.

The cleanliness of each of the boards was evaluated by use of an Omega meter 600 SMD ionic testing device (sold by Alpha Metals Inc.). The average for the three boards was a contamination reading of only 9.3 micrograms NaCl equivalent/square inch.

The next example is a comparative example which is illustrative of a prior art process.

Example No. C-1

The same procedure as described in Example No. 1 above was followed except that cleaning was effected with a composition comprising 90 wt. % of the terpene cleaning composition described in Example No. 1 above and 10 wt. % of a mixture of emulsifying surfactants. The mixture comprised 50 wt. % of an ethoxylated sorbitan ester and 50 wt. % of an ethoxylated linear alcohol. The average for the three boards that were cleaned was a reading of 9.4 micrograms NaCl equivalent/square inch—essentially the same as that of the boards of Example No. 1. However, the rinse water has a COD in excess of 5,000 ppm.

As mentioned above, monobasic esters can be used effectively in a terpene-based cleaning composition in which they comprise a minor amount of the composition. It has been found also that a composition comprising a major amount of a monobasic ester can be used effectively in a variety of different types of cleaning applications which heretofore involved the use of halocarbons and alkaline detergents, the use of each of the aforementioned being accompanied by serious disadvantages. The monobasic esters, which can be used to clean a variety of surfaces, for example, metals, plastics, and electronic assemblies, offer the advantages of water insolubility, low toxicity, low skin irritation, high flash point and low odor.

Examples of monobasic esters that can be used in the cleaning operation are methyl, ethyl, and isopropyl esters of medium chain (about $C_8$ to about $C_{18}$) monobasic acids.

The conditions under which the monobasic esters are used are typical of conditions used for other organic cleaning solvents. They can be used, for example, at a temperature within the range of room temperature to about 150° F. or higher and under conditions which involve a contact time of about 1 to about 10 minutes. Conventional means can be used to apply the monobasic esters to the soiled substrates, for example, spray, agitated immersion, and soaking.

Examples of some cleaning applications in which monobasic esters can be used effectively are as follows.

Methyl laurate (100%) was used to clean small metal parts of metal chips and cutting oils. The parts were dipped in the methyl laurate, blasted with compressed air to remove excess liquid and soils, and gauged with measuring instruments to determine part dimensions. The results were deemed to be fully satisfactory relative to the use of a conventional chlorofluorocarbon (CFC-113).

In another example, soiled laboratory uniforms were dry cleaned in a cleaning composition comprising 88 wt. % isopropyl myristate, 12 wt. % of a surfactant mixture consisting of Tergitol NP-4 (4 wt. %), Tergitol NP-7 (2 wt. %), Macel 2 (2 wt. %), Cyclegel SBDO (2 wt. %), and dipropylene glycol (2 wt. %). Following the wash, the uniforms were rinsed in water. After drying, the uniforms were found to be satisfactorily clean.

In another experiment, the methyl ester of capric acid was used to clean a printed wiring assembly which had been soldered using rosin flux. The cleaning performance was equivalent to that obtained with a terpene/surfactant mixture (BIOACT® EC-7 ™ Petroferm Inc.).

Thus, monobasic esters are useful as cleaning agents. They are capable of dissolving a variety of common contaminants and offer the advantages indicated earlier relative to other cleaning agents.

We claim:

1. An industrial cleaning process in which a contaminant comprising soldering flux and/or adhesive tape residue is removed from a substrate contaminated therewith consisting essentially of:
   (A) contacting the substrate with a terpene-based cleaning composition which is substantially free of water-soluble organic material for a period of time sufficient to solubilize the contaminant;

(B) removing the composition and solubilized contaminant from the substrate by contact with water having a temperature of about 70° F. to about 140° F. for a period of time of no longer than about 10 minutes to provide a substrate having a contamination rating of no greater than about 14 micrograms NaGl equivalent/square inch (MIL-P-28809A), and to thereby form a mixture comprising the composition, contaminant and water; and (C) separating the water from said mixture, the separated water being substantially free of water-soluble organic material and having a chemical oxygen demand of no greater than about 1,000 ppm.

2. A process according to claim 1 wherein the composition and solubized contaminant are removed from the substrate by water spray.

3. A process according to claim 1 wherein said contact with water is effected under conditions to provide a substrate having a cleanliness rating of below about 10 micrograms.

4. A process according to claim 1 wherein the water is separated from the mixture by gravitational force, 5. A process according to claim 4 wherein the separated water is discharged to a sewage system.

6. A process according to claim 5 wherein the COD of the separated water is no greater than about 300 ppm.

7. A process according to claim 6 wherein the COD of the separated water is no greater than about 150 ppm.

8. A process according to claim 1 wherein the substrate is contaminated with soldering flux.

9. A process according to claim 1 wherein the flux is rosin flux.

10. A process according to claim 1 wherein the temperature of the water is about 110° F. to about ]30° F. and the period of time is no longer than about 5 minutes.

* * * * *